(12) United States Patent
Lee et al.

(10) Patent No.: US 7,151,034 B2
(45) Date of Patent: Dec. 19, 2006

(54) SEMICONDUCTOR DEVICE AND METHOD FOR MANUFACTURING THE SAME

(75) Inventors: Sang Don Lee, Gyeonggi-do (KR); Yil Wook Kim, Seoul (KR); Jin Hong Ahn, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 11/165,178

(22) Filed: Jun. 24, 2005

(65) Prior Publication Data

US 2006/0121679 A1 Jun. 8, 2006

(30) Foreign Application Priority Data

Dec. 8, 2004 (KR) .................. 10-2004-0102886

(51) Int. Cl.
*H01L 21/336* (2006.01)

(52) U.S. Cl. ..................... 438/300; 438/301

(58) Field of Classification Search ........ 438/300–301, 438/294, 305, 151, 163, 174, 194, 197, 481; 257/335–336, 288
See application file for complete search history.

(56) References Cited

U.S. PATENT DOCUMENTS 6,518,134 B1 * 2/2003 Yang et al. ............... 438/301
6,713,356 B1 3/2004 Skotnicki et al.
2006/0035417 A1 * 2/2006 Lee ........................... 438/149

FOREIGN PATENT DOCUMENTS

| EP | 0 535 814 A1 | 4/1993 |
|---|---|---|
| EP | 1 039 546 A1 | 9/2000 |
| FR | 2 838 237 A1 | 10/2003 |
| KR | 1020010045 580 A | 6/2001 |
| KR | 1020040049 658 A | 6/2004 |

OTHER PUBLICATIONS

Malgorzata Jurczak et al., "Silicon-on-Nothing (SON)-an Innovative Process for Advanced CMOS", IEEE, Nov. 2000, pp. 2179-2187, vol. 47, No. 11.

* cited by examiner

*Primary Examiner*—Theresa T. Doan
(74) *Attorney, Agent, or Firm*—Heller Ehrman LLP

(57) ABSTRACT

The present invention discloses improved semiconductor device and method for manufacturing wherein one side of a source and drain region and a portion of a channel region are disposed on a buried oxide layer formed on a semiconductor substrate and the side of the source and drain region and another portion of the channel region are disposed on a Si epitaxial layer formed on a semiconductor substrate.

15 Claims, 24 Drawing Sheets

SEMICONDUCTOR DEVICE AND METHOD FOR MANUFACTURING THE SAME

BACKGROUND OF THE INVENTION

1. Field of the Invention

The present invention relates to semiconductor device and method for manufacturing the same, and in particular to an improved semiconductor device and method for manufacturing the same wherein one side of a source and drain region and a portion of a channel region are disposed on a buried oxide layer formed on a semiconductor substrate and the side of the source and drain region and another portion of the channel region are disposed on a Si epitaxial layer formed on a semiconductor substrate to reduce a junction leakage current and junction capacitance and suppress a short channel effect thereby improving characteristics of the semiconductor device.

2. Description of the Related Art

FIGS. 1 and 2 are a layout illustrating a conventional semiconductor device, and a cross-sectional view of the conventional semiconductor device taken along the line I–I' and II–II' of FIG. 1, respectively.

Referring to FIGS. 1 and 2, the semiconductor device in accordance with the conventional art comprises a semiconductor substrate 10 having an active region defined by a device isolation film 25, and a buried oxide film 50 is disposed on a surface of the semiconductor substrate 10. A Si epitaxial layer 20 is disposed on the buried oxide film 50, and a channel region (not shown) and an LDD region 40 are disposed in the Si epitaxial layer 20. A gate structure, which comprises a stacked structure of a gate insulating film 30a, a gate electrode 35a and a hard mask film pattern 37a, is disposed on the channel region. A gate spacer 45 is disposed on a side of the gate structure, and a source/drain region 55 is disposed in the active region at both sides of the gate spacer 45.

FIGS. 3A through 3F are cross-sectional views illustrating a method for manufacturing the conventional semiconductor device shown in FIG. 2 taken along the line I–I' and II–II' of FIG. 1.

Referring to FIG. 3A, a SiGe epitaxial layer 15 and a Si epitaxial layer 20 are sequentially stacked on a semiconductor substrate 10. Thereafter, a device isolation film 25 defining an active region is formed on the semiconductor substrate 10.

Referring to FIG. 3B, an impurity is implanted into the Si epitaxial layer 20 to form a channel region (not shown). Thereafter, a gate insulating film 30, a gate conductive layer 35 and a hard mask insulating film 37 are sequentially formed on the entire surface.

Referring to FIG. 3C, the hard mask insulating film 37, the gate conductive layer 35 and the gate insulating film 30 are patterned to form a gate structure including a stacked structure of a hard mask insulating film pattern 37a, a gate electrode 35a and a gate insulating film pattern 30a. Thereafter, an impurity is implanted into the Si epitaxial layer 20 at both sides of the gate structure to form an LDD region 40.

Referring to FIG. 3D, a sidewall spacer 45 is formed on a side of the gate structure. Thereafter, a portion of the Si epitaxial layer 20, a portion of the SiGe epitaxial layer 15 and a predetermined thickness of the semiconductor substrate 10 at both sides of the sidewall spacer 45 are removed by etching to expose a side of the LDD region 40 and the SiGe epitaxial layer 15 and a side and a surface of the semiconductor substrate 10.

Referring to FIG. 3E, the SiGe epitaxial layer 15 below the gate electrode 35a are removed by an wet etching process to form a space under the Si epitaxial layer 20, i.e. under the LDD region 40 and the channel region.

Referring to FIG. 3F, an oxide film is formed in the space formed below the gate electrode 35a by removing the SiGe epitaxial layer 15 and the surfaces of the exposed portions of the Si epitaxial layer 20 and the semiconductor substrate 10. The oxide film is then etched to form a buried oxide film 50 filling the space below the gate electrode 35a.

Referring to FIG. 3G, a silicon layer 55 is grown on the active region where the Si epitaxial layer 20, the SiGe epitaxial layer 15 and the predetermined thickness of the semiconductor substrate 10 were removed, and then subjected to an impurity implant process to form a source/drain region in the silicon layer 55.

As described above, in accordance with the conventional semiconductor device and method for manufacturing the same, the semiconductor substrate and the channel region is electrically isolated since the entire channel region under the gate electrode is formed on the buried oxide film, whereby the voltage applied to the gate electrode is only partially applied to the semiconductor substrate. Therefore, when the thickness of the Si epitaxial layer is reduced to suppress a short channel effect, a threshold voltage is also reduced since the threshold voltage is determined by the doping concentration of the channel region and the thickness of the Si epitaxial layer. Moreover, the source/drain region is electrically connected to the semiconductor substrate resulting in increase in junction leakage current and junction capacitance of the source/drain region.

SUMMARY OF THE INVENTION

It is an object of the present invention to provide a semiconductor device and method for manufacturing the same wherein one side of a source and drain region and a portion of a channel region are disposed on a buried oxide layer formed on a semiconductor substrate and the side of the source and drain region and another portion of the channel region are disposed on a Si epitaxial layer formed on a semiconductor substrate to reduce junction leakage current and junction capacitance and suppress a short channel effect thereby improving characteristics of the semiconductor device.

In order to achieve the above-described object of the present invention, there is provided a method for manufacturing a semiconductor device, the method comprising the steps of:

(a) forming a device isolation film defining an active region on a semiconductor substrate, the semiconductor substrate having a SiGe epitaxial layer and a first Si epitaxial layer stacked thereon, (b) sequentially forming a gate insulating film, a gate conductive layer and a first CVD insulating film on the first Si epitaxial layer and the device isolation film, (c) patterning the first CVD insulating film and the gate conductive layer to form a gate structure having a first side and a second side, (d) forming an LDD region on the first Si epitaxial layer at both sides of the gate structure, (e) forming a first sidewall spacer and a second sidewall spacer on the first side and the second side respectively, (f) at least etching a portion of the gate insulating film adjacent to the first sidewall spacer and the second sidewall spacer to expose a portion of the first Si epitaxial layer, (g) etching the exposed portion of the first Si epitaxial layer to expose a portion of the SiGe epitaxial layer, (h) etching the SiGe epitaxial layer adjacent to the first side and a predetermined thickness of the semiconductor substrate thereunder, wherein the SiGe epitaxial layer is partially etched so as to form a first undercut under the first Si epitaxial layer, (i) forming a second Si epitaxial layer in a space including the first undercut, wherein the second Si epitaxial layer at least fills up the first undercut, (j) performing an etching process to expose the SiGe epitaxial layer adjacent to the second side, (k) etching the SiGe epitaxial layer exposed in the step (j), wherein the SiGe epitaxial layer is removed so as to form a second undercut under the first Si epitaxial layer, (l) forming a buried oxide film filling up the second undercut in a space formed by removing the SiGe epitaxial layer, (m) forming a polysilicon layer on the buried oxide film filling up a space formed by removing the gate insulating film and the first Si epitaxial layer, and (n) implanting an impurity into the second Si epitaxial layer and the polysilicon layer to form a source/drain region.

In order to achieve the above-described object of the present invention, there is provided a semiconductor device, comprising:

a semiconductor substrate having an active region defined by a device isolation film, a gate structure having a first side and a second side, the gate structure comprising a stacked structure of a gate insulating film, a gate electrode and a first CVD insulating film, a first sidewall spacer and a second sidewall spacer respectively disposed on the first side and the second side of the gate structure, an LDD region disposed in a first Si epitaxial layer under the gate insulating film, a second Si epitaxial layer disposed on the semiconductor substrate adjacent to the first sidewall spacer, wherein the second Si epitaxial layer extends to a predetermined depth under the first epitaxial layer, a buried oxide film disposed on the semiconductor substrate adjacent to the second sidewall spacer, wherein the buried oxide film extends the predetermined depth under the first Si epitaxial layer, and a source/drain region disposed on the second Si epitaxial layer and the buried oxide film.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE EXEMPLARY EMBODIMENTS

Reference will now be made in detail to exemplary embodiments of the present invention. Wherever possible, the same reference numbers will be used throughout the drawings to refer to the same or like parts.

Figure 1:
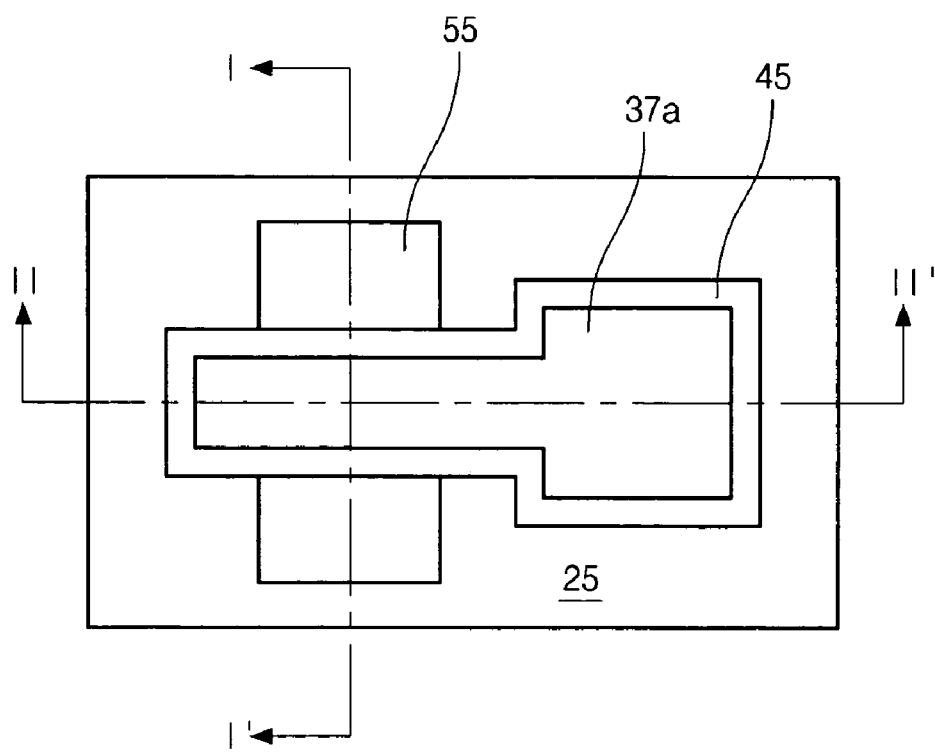
FIG. 1 is a layout illustrating a conventional semiconductor device.
Figure 2:
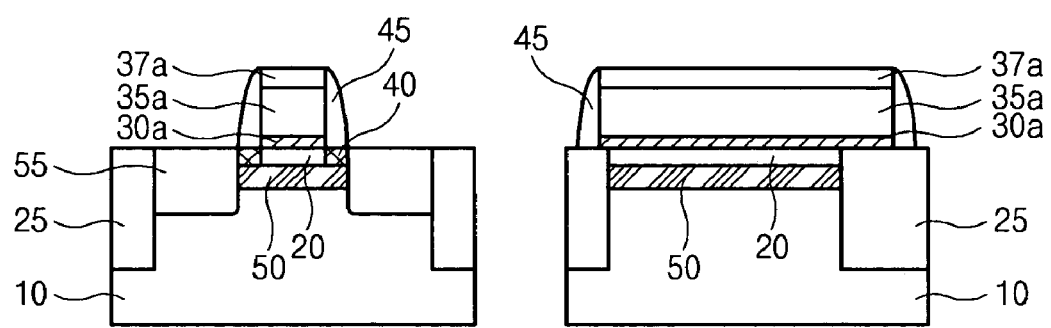
FIG. 2 is a cross-sectional view of the conventional semiconductor device taken along the line I–I' and II–II' of FIG. 1.
Figure 3A:
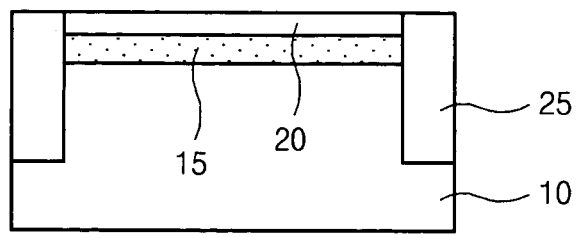
FIGS. 3A through 3G are cross-sectional views illustrating a method for manufacturing the conventional semiconductor device shown in FIG. 2.
Figure 3B:
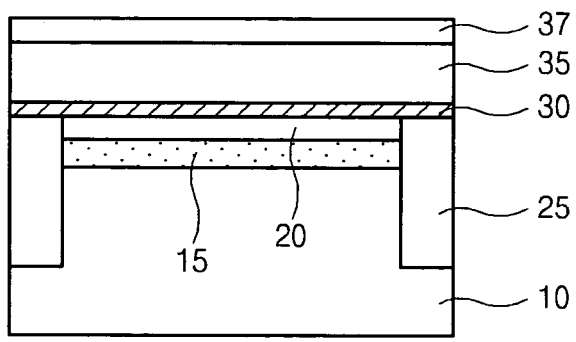
Figure 3C:
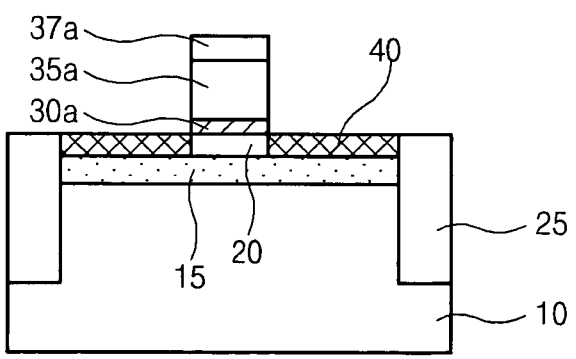
Figure 3D:
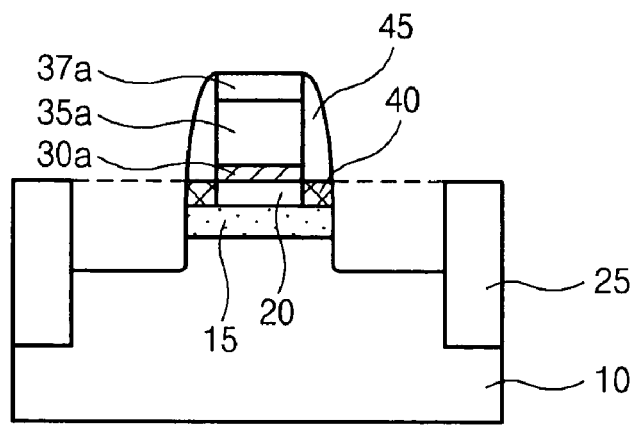
Figure 3E:
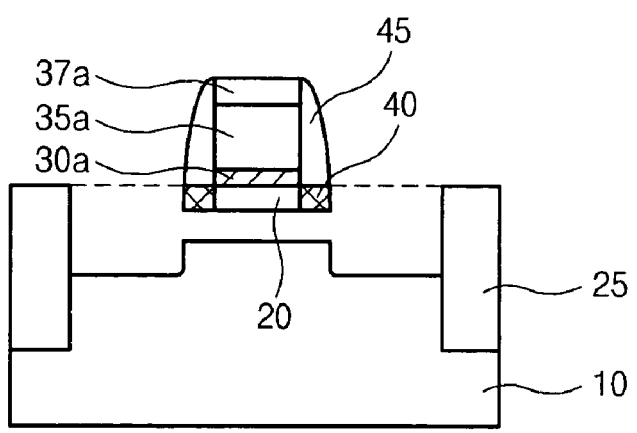
Figure 3F:
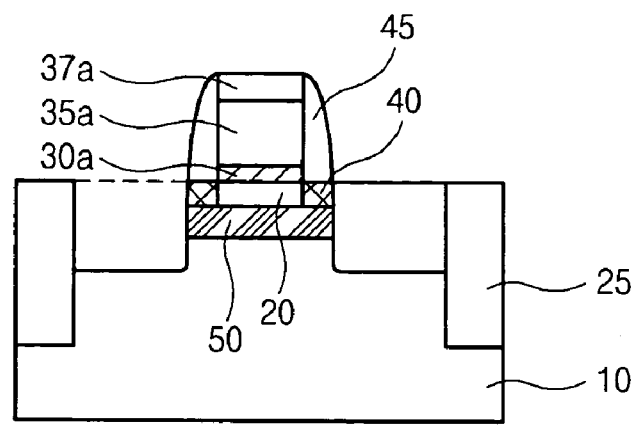
Figure 3G:
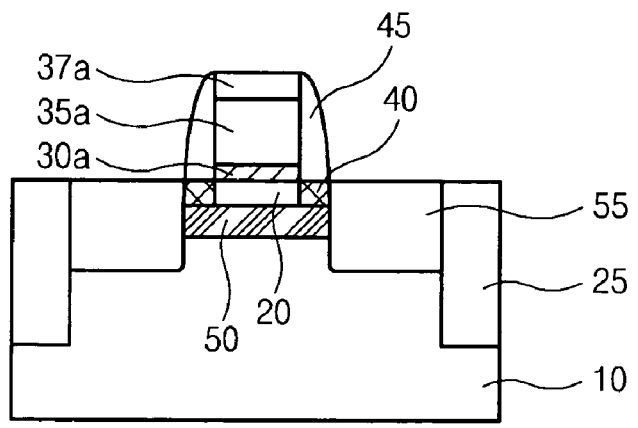
Figure 4:
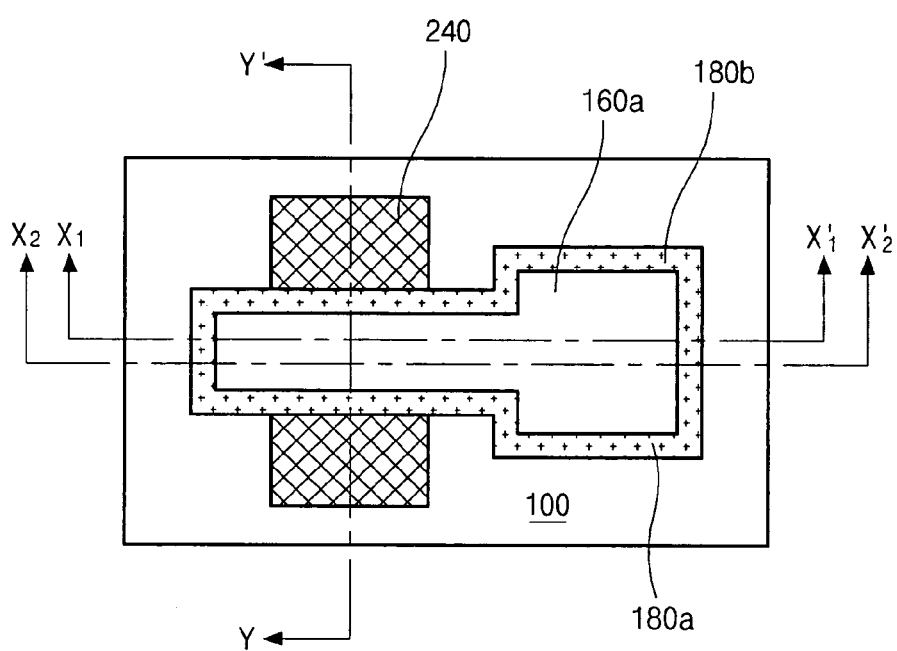
FIG. 4 is a layout illustrating a semiconductor device in accordance with the present invention.
Figure 5A:
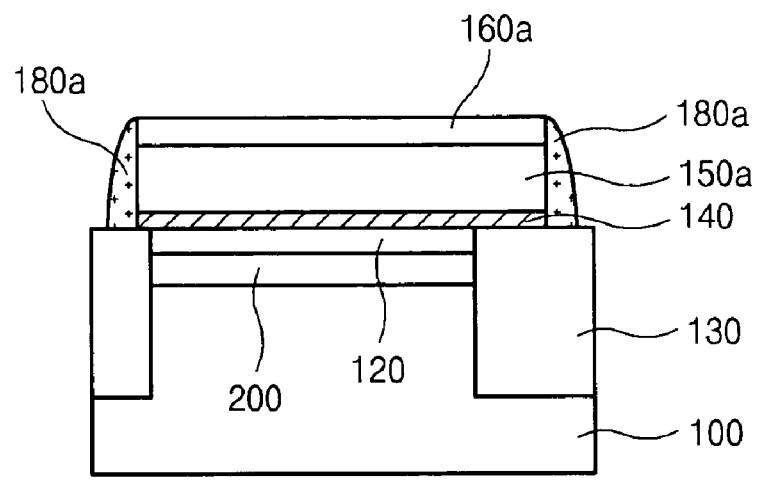
FIGS. 5A through 5C are cross-sectional views illustrating a semiconductor device in accordance with a first preferred embodiment of the present invention respectively taken along the line $X_1-X_1'$, $X_2-X_2'$, and Y–Y' of FIG. 4.
Figure 5B:
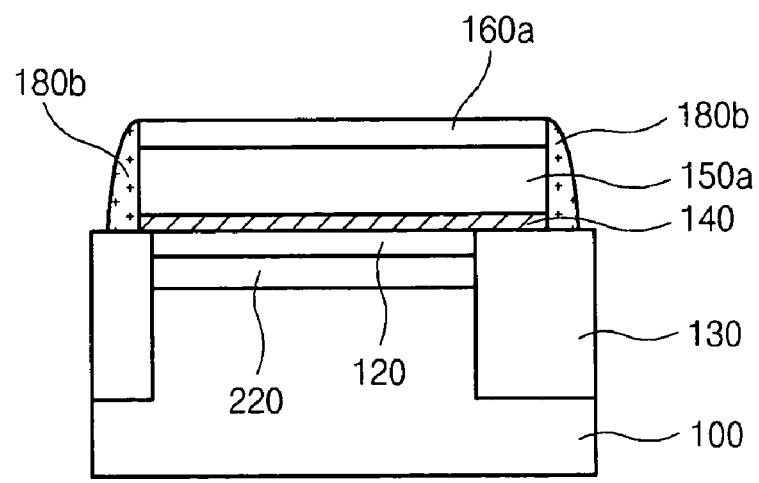
Figure 5C:
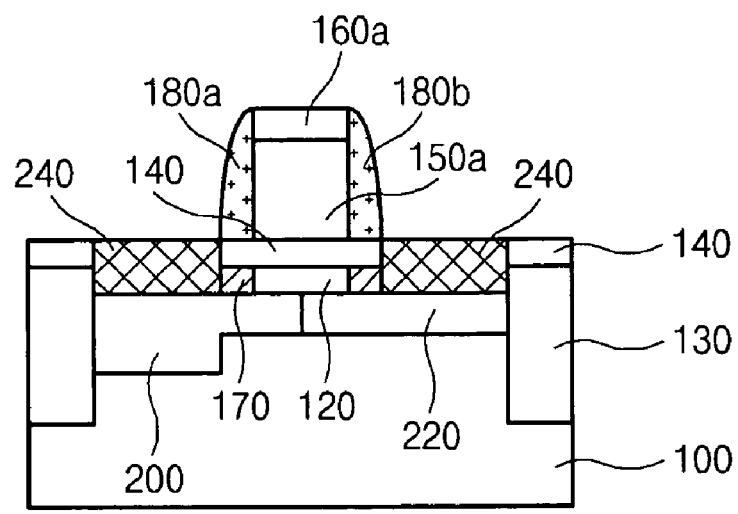

FIG. 4 is a layout illustrating a semiconductor device in accordance with the present invention, and FIGS. 5A through 5C are cross-sectional views illustrating a semiconductor device in accordance with a first preferred embodiment of the present invention respectively taken along the line $X_1-X_1'$, $X_2-X_2'$, and Y–Y' of FIG. 4.

Referring to FIGS. 4 and 5A through 5C, the semiconductor device in accordance with the first preferred embodiment of the present invention comprises a semiconductor substrate 100 having an active region defined by a device isolation film 130, a gate structure having a first side 500a and a second side 500b. The gate structure comprises a stacked structure of a gate insulating film 140, a gate electrode 150a and a first CVD insulating film 160a. The device also comprises a first sidewall spacer 180a and a second sidewall spacer 180b respectively disposed on the first side 500a and the second side 500b, and an LDD region 170 disposed in a first Si epitaxial layer 120 under the gate insulating film 140. A second Si epitaxial layer 200, which is disposed on the semiconductor substrate 100 adjacent to the first sidewall spacer 180a, extends to a predetermined depth under the first Si epitaxial layer 120 to fill an undercut. The second Si epitaxial layer 200 may fill a recess disposed on the semiconductor substrate 100 adjacent to the first sidewall spacer 180a. A buried oxide film 220, which is disposed on the semiconductor substrate 100 adjacent to the second sidewall spacer 180b, extends the predetermined depth under the first Si epitaxial layer 120 to fill up the undercut. The device also comprises a source/drain region 240 disposed on the second Si epitaxial layer 200 and the buried oxide film 220.

FIGS. 6A through 6J are cross-sectional views illustrating a method for manufacturing a semiconductor device in accordance with the first preferred embodiment of the present invention.

Figure 6A:
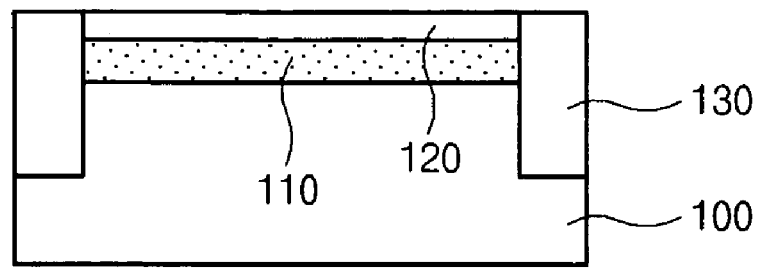
FIGS. 6A through 6J are cross-sectional views illustrating a method for manufacturing semiconductor device in accordance with the first preferred embodiment of the present invention.

Referring to FIG. 6A, a SiGe epitaxial layer 110 and a first Si epitaxial layer 120 are sequentially stacked on a semiconductor substrate 100. Thereafter, a device isolation film 130 defining an active region is formed on the semiconductor substrate 100. A channel region (not shown) is then formed in the first Si epitaxial layer 120.

Figure 6B:
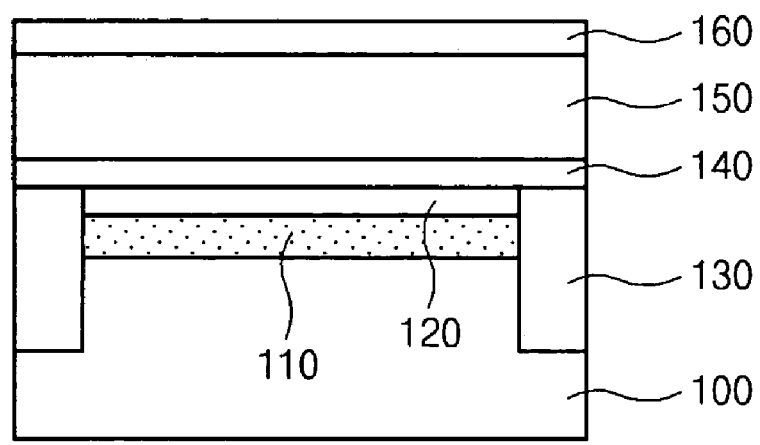

Referring to FIG. 6B, a gate insulating film 140, a gate conductive layer 150 and a first CVD insulating film 160 are sequentially formed on the entire surface including the first Si epitaxial layer 120 and the device isolation film 130. Preferably, the first CVD insulating film 160 comprises an oxide film, a nitride film or a stacked structure thereof.

Figure 6C:
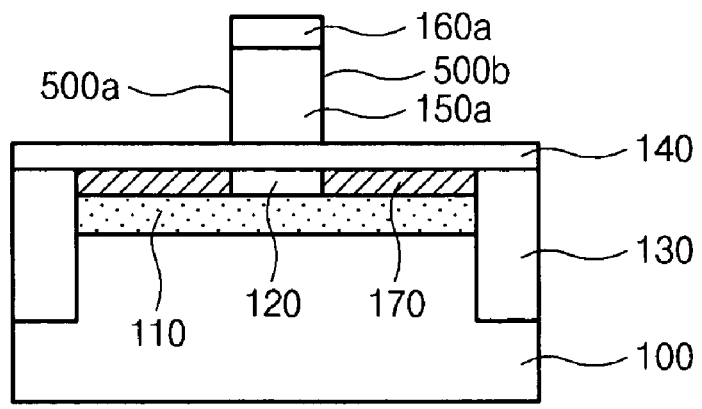

Referring to FIG. 6C, the first CVD insulating film 160 and the gate conductive layer 150 are patterned via a lithography and etching process using a gate mask (not shown) to form a gate structure including a stacked structure of a first CVD insulating film pattern 160a and the gate electrode 150a. The gate structure has a first side 500a and a second side 500b. Thereafter, an impurity is implanted into the first Si epitaxial layer 120 at both sides of the gate structure to form an LDD region 170.

Figure 6D:
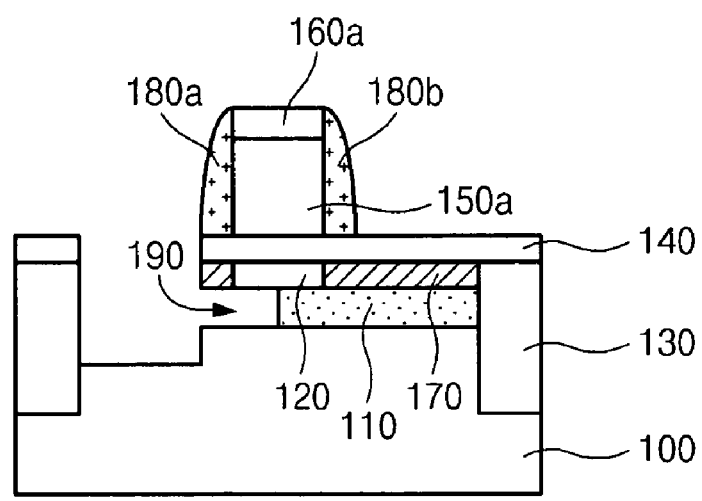

Referring to FIG. 6D, an insulating layer (not shown) comprising an oxide film or a nitride film is deposited on the entire surface and then etched to form a first sidewall spacer 180a and a second sidewall spacer 180b on the first side 500a and the second side 500b, respectively. Thereafter, a photoresist film (not shown) is formed on the entire surface, and then selectively exposed and developed to form a photoresist film pattern exposing a portion of the gate insulating film 140 adjacent to the first sidewall spacer 180a. Next, the exposed portion of the gate insulating film 140 adjacent to the first sidewall spacer 180a, the first Si epitaxial layer 120 and the SiGe epitaxial layer 110 thereunder are etched to expose a side of the SiGe epitaxial layer 110 adjacent to the first sidewall spacer 180a and the semiconductor substrate 100. Thereafter, a predetermined thickness of the semiconductor substrate 100 is recessed. The photoresist film pattern is then removed. Next, the exposed portion of the side of the SiGe epitaxial layer 110 is etched via an wet etching process to form a first undercut 190 under the first Si epitaxial layer 120.

Figure 6E:
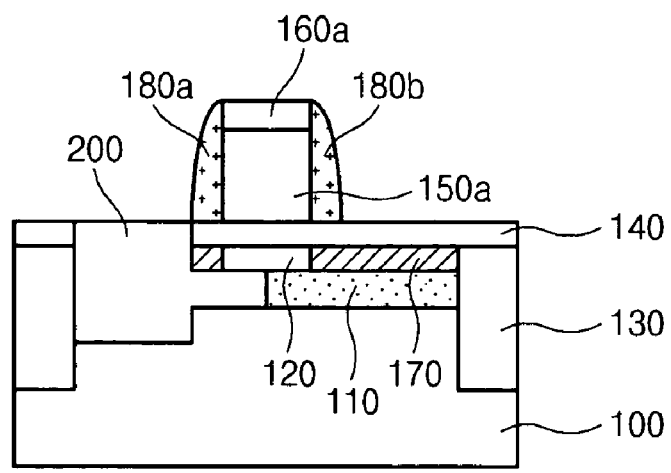

Referring to FIG. 6E, a second Si epitaxial layer 200 is formed in a space including the first undercut 190 adjacent to the first sidewall spacer 180a. The second Si epitaxial layer 200 at least fills up the first undercut 190 and the recess of the semiconductor substrate 100. Preferably, the second Si epitaxial layer 200 is doped so as to have the same conductive type as the semiconductor substrate 100.

Figure 6F:
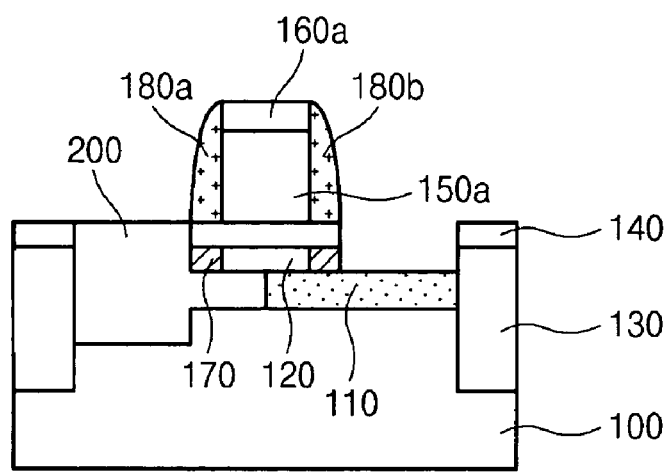

Referring to FIG. 6F, a photoresist film (not shown) is formed on the entire surface, and then selectively exposed and developed to form a photoresist film pattern exposing a portion of the gate insulating film 140 adjacent to the second sidewall spacer 180b. Next, the exposed portion of the gate insulating film 140 adjacent to the second sidewall spacer 180b and the first Si epitaxial layer 120 thereunder are etched to expose the SiGe epitaxial layer 110 adjacent to the second sidewall spacer 180b. The photoresist film pattern is then removed.

Figure 6G:
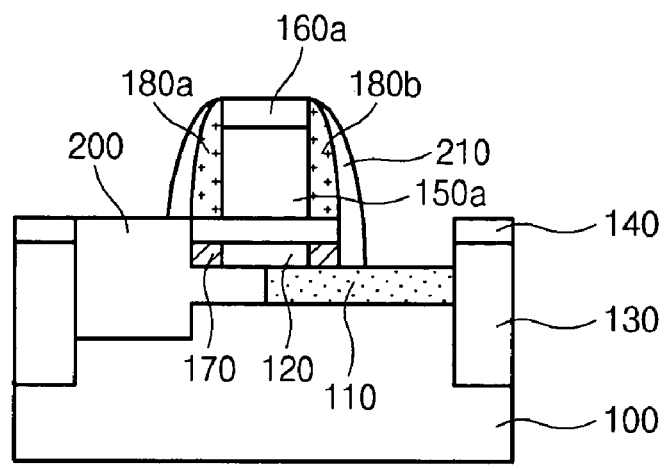

Referring to FIG. 6G, a second CVD insulating film (not shown) is formed on the entire surface preferably using a nitride film, and then etched to form a second CVD sidewall spacer 210 on surfaces the first sidewall spacer 180a and the second sidewall spacer 180b and also on a surface of the gate insulating film 140 and an exposed portion of the side of the first Si epitaxial layer 120.

Figure 6H:
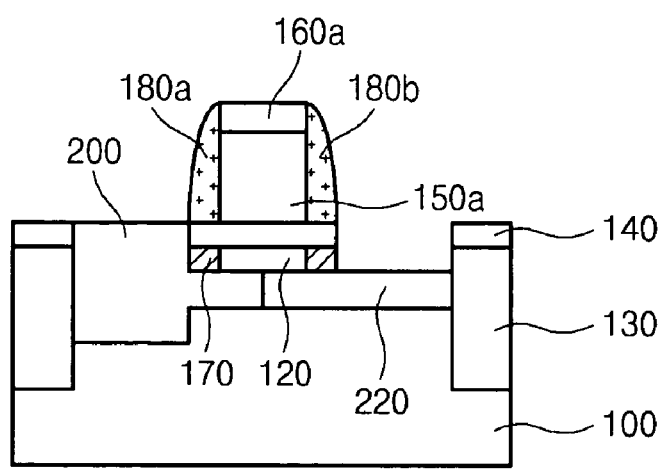

Referring to FIG. 6H, the SiGe epitaxial layer 110 is removed via a wet etching process using the second CVD spacer 210 as an etching mask. A second undercut (not shown) is formed under the first Si epitaxial layer 120 by removing the SiGe epitaxial layer 110. Thereafter, a buried oxide film 220 filling the second undercut is formed on the semiconductor substrate 100 in a space formed by removing the SiGe epitaxial layer 110. Next, the second CVD spacer 210 is removed.

Figure 6I:
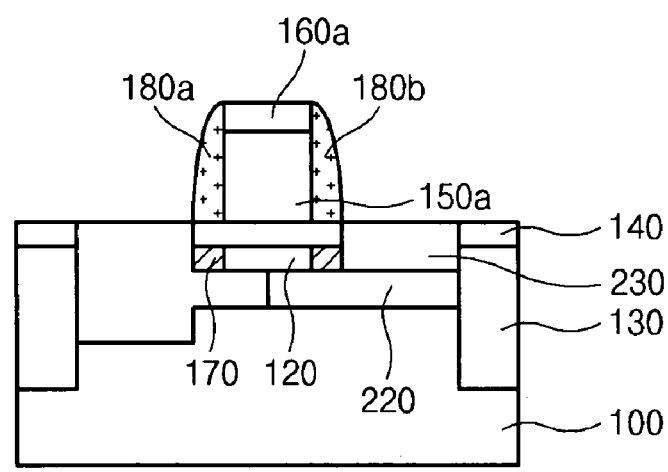

Referring to FIG. 6I, a polysilicon layer (not shown) is formed on the entire surface, and then etched back to form a polysilicon layer 230 for a source/drain region filling a space formed by removing the gate insulating film 140 and the first Si epitaxial layer 120 adjacent to the second sidewall spacer 180b. Although not shown, a third epitaxial layer covering an exposed portion of a sidewall of the LDD region 170 may further be formed prior to the formation of the polysilicon layer 230.

Figure 6J:
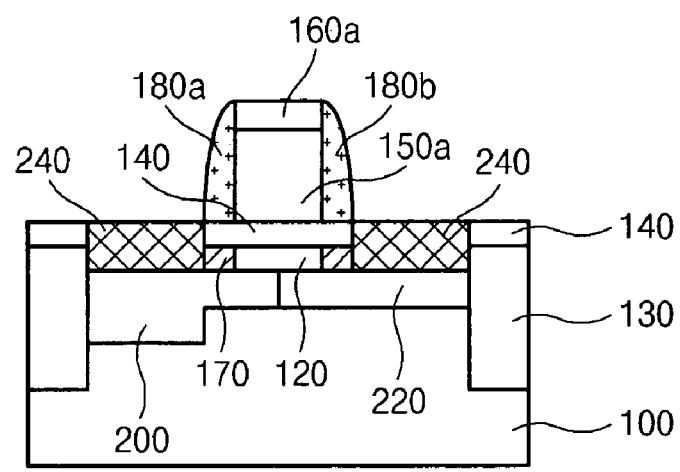

Referring to FIG. 6J, an impurity is implanted into the second Si epitaxial layer 200 and the polysilicon layer 230 to form a source/drain region 240.

Figure 7A:
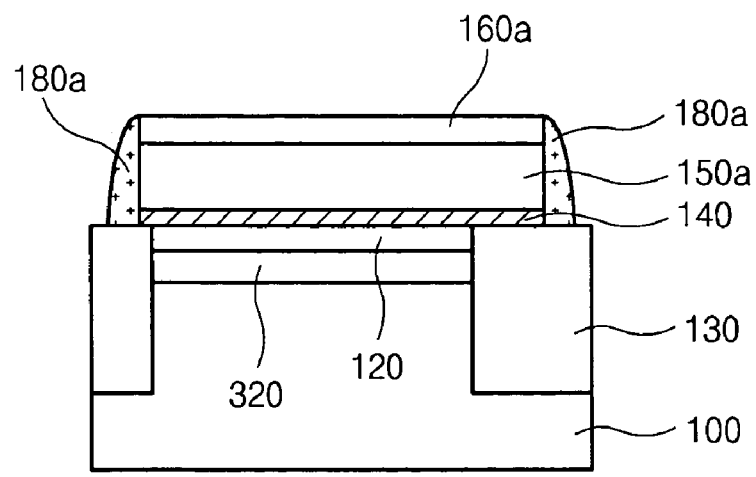
FIGS. 7A through 7C are cross-sectional views illustrating a semiconductor device in accordance with a second preferred embodiment of the present invention respectively taken along the line $X_1-X_1'$, $X_2-X_2'$, and Y–Y' of FIG. 4.
Figure 7B:
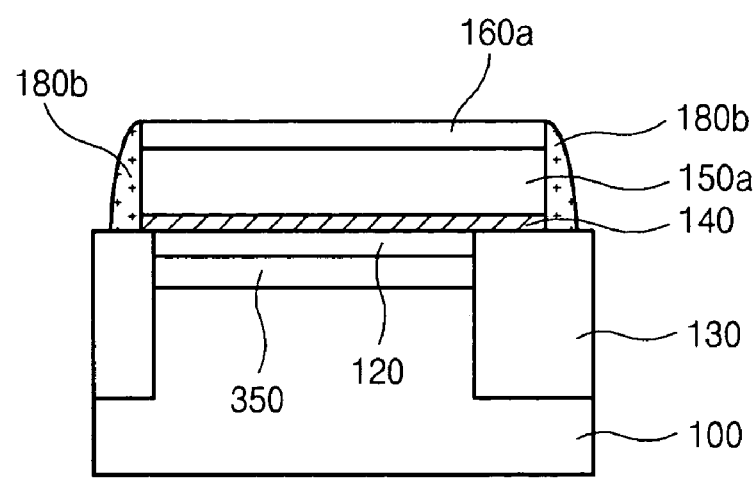
Figure 7C:
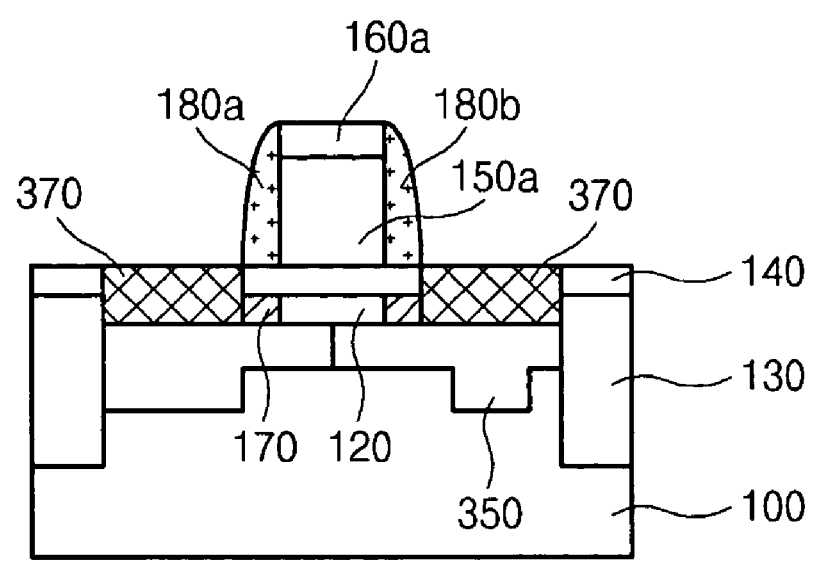

FIGS. 7A through 7C are cross-sectional views illustrating a semiconductor device in accordance with a second preferred embodiment of the present invention respectively taken along the line $X_1-X_1'$, $X_2-X_2'$, and $Y-Y'$ of FIG. 4.

Referring to FIGS. 7A through 7C, the semiconductor device in accordance with a second preferred embodiment of the present invention is the same as that of the first preferred embodiment of the present invention shown in FIGS. 5A through 5C except a recess disposed on the semiconductor substrate 100 adjacent to the second sidewall spacer 180b, which is filled by the buried oxide film 350.

FIGS. 8A through 8G are cross-sectional views illustrating a method for manufacturing semiconductor device in accordance with the second preferred embodiment of the present invention.

The processes shown in FIGS. 6A through to 6C are performed to form the structure shown in FIG. 6C.

Figure 8A:
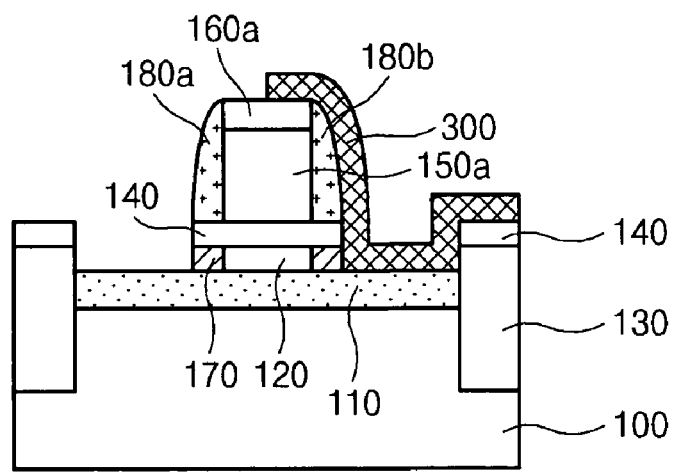
FIGS. 8A through 8G are cross-sectional views illustrating a method for manufacturing semiconductor device in accordance with the second preferred embodiment of the present invention.

Referring to FIG. 8A, an CVD insulating layer (not shown) comprising an oxide film or a nitride film is deposited on the entire surface, and then etched to form a first sidewall spacer 180a and a second sidewall spacer 180b on the first side 500a and the second side 500b, respectively. Thereafter, the gate insulating film 140 and the first Si epitaxial layer 120 at both sides of the gate structure are sequentially etched to expose the SiGe epitaxial layer 110. A third CVD insulating film (not shown) is then disposed on the entire surface. The third CVD insulating film 300 on the first sidewall spacer 180a is removed by etching using a photoresist film pattern (not shown) exposing the third CVD insulating film 300 adjacent to the first sidewall spacer 180a to form a third CVD insulating film pattern 300 covering the second sidewall spacer 180b and a portion of the SiGe epitaxial layer 110 adjacent to the second sidewall spacer 180b. Next, the photoresist film pattern is removed.

Figure 8B:
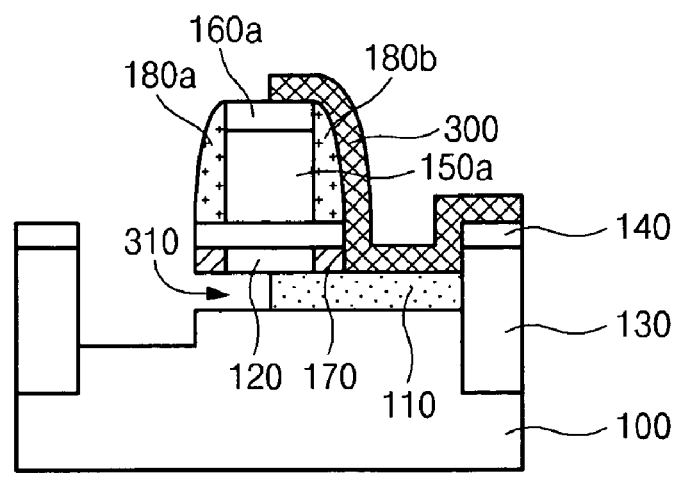

Referring to FIG. 8B, the SiGe epitaxial layer 110 adjacent to the first sidewall spacer 180a is etched to expose a portion of the semiconductor substrate 100. Thereafter, the exposed portion of the semiconductor substrate 100 is recessed by etching. An exposed portion of a side of the SiGe epitaxial layer 110 is etched to form a first undercut 310 under the first Si epitaxial layer 120.

Figure 8C:
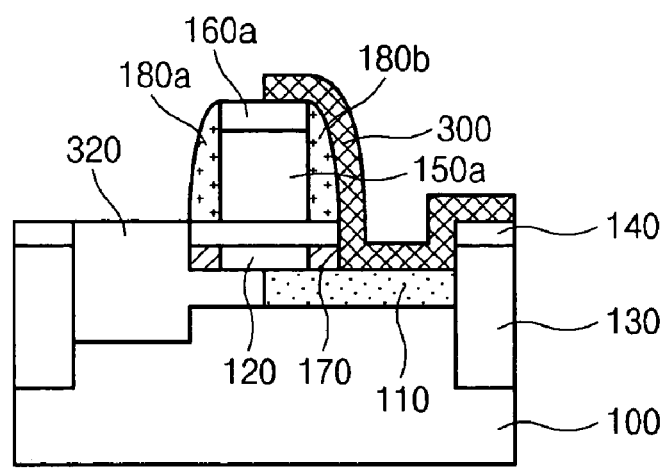

Referring to FIG. 8C, a second Si epitaxial layer 320 is formed in a space including the first undercut 310 adjacent to the first sidewall spacer 180a. The second Si epitaxial layer 320 at least fills up the first undercut 310 and the recess of the semiconductor substrate 100.

Figure 8D:
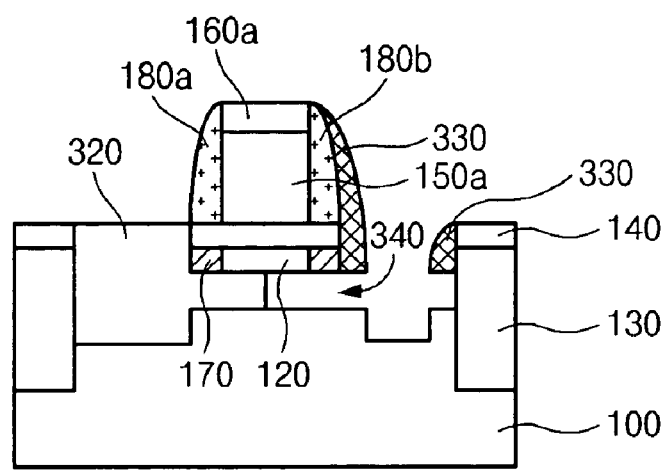

Referring to FIG. 8D, the third CVD insulating film pattern 300 is etched using a photoresist film pattern (not shown) exposing a portion of the third CVD insulating film pattern 300 on the second sidewall spacer 180b as an etching mask to form a third CVD sidewall spacer 330 on a surface of the second sidewall spacer 180b, a side of the gate insulating film 140 and the first Si epitaxial layer 120, and a exposed side of the device isolation film 130, and to expose the SiGe epitaxial layer 110 adjacent to the second sidewall spacer 180b. Thereafter, the SiGe epitaxial layer 110 is etched using the third CVD sidewall spacer 330 as an etching mask to expose a portion of the semiconductor substrate 100. The exposed portion of the semiconductor substrate 100 is then recessed by etching. Next, the photoresist film pattern is removed. An exposed side of the SiGe epitaxial layer 110 is removed via a wet etching process to form a second under cut 340 under the first Si epitaxial layer 120.

Figure 8E:
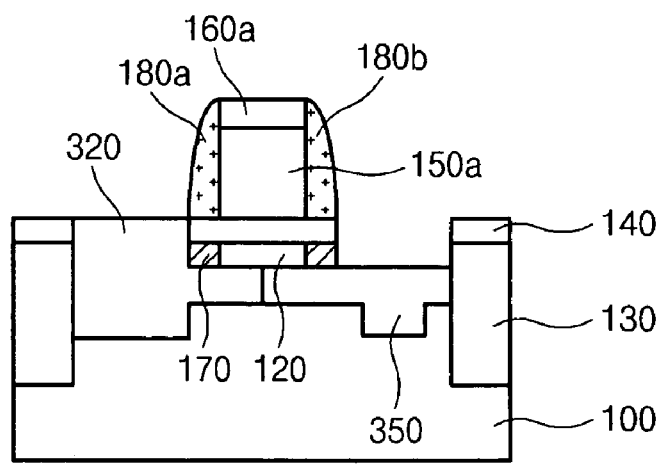

Referring to FIG. 8E, a buried oxide film 350 filling the second undercut 340 is formed on the semiconductor substrate 100 in a space formed by removing the SiGe epitaxial layer 110. Thereafter, the third CVD sidewall spacer 330 is removed.

Figure 8F:
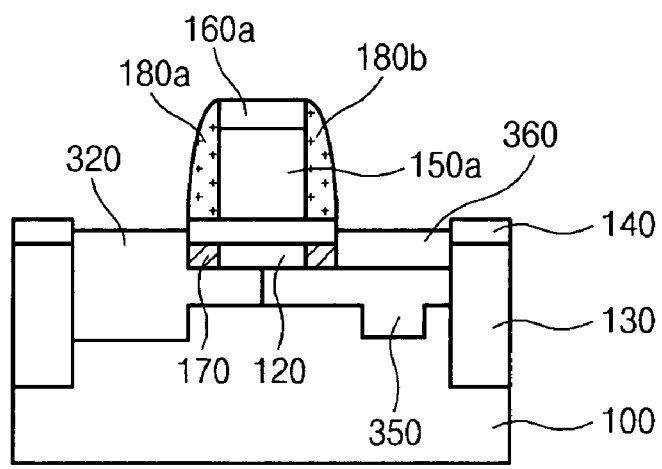

Referring to FIG. 8F, a polysilicon layer (not shown) is formed on the entire surface and then etched back to form a polysilicon layer pattern 360 for a source/drain region filling a space formed by removing the gate insulating film 140 and the first Si epitaxial layer 120 on the buried oxide film 350. Although not shown, a third epitaxial layer covering an exposed portion of a side of the LDD region 170 may further be formed prior to the formation of the polysilicon layer pattern 360.

Figure 8G:
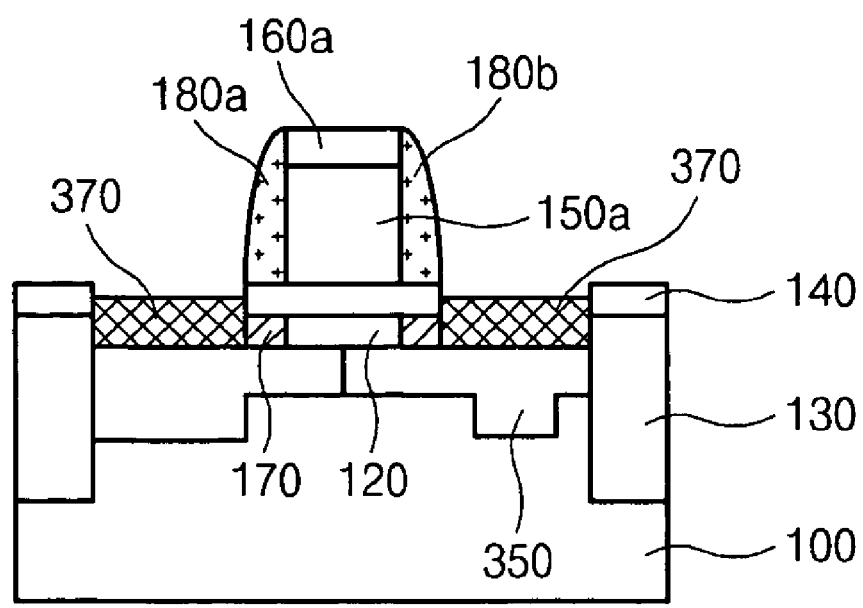

Referring to FIG. 8G, an impurity is implanted into the second Si epitaxial layer 320 and the polysilicon layer pattern 360 to form a source/drain region 370.

Figure 9A:
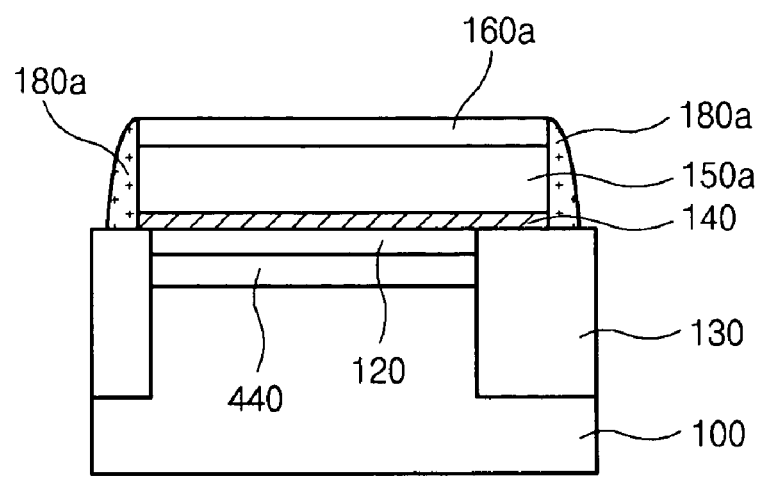
FIGS. 9A through 9C are cross-sectional views illustrating a semiconductor device in accordance with the third preferred embodiment of the present invention respectively taken along the line X1–X1', X2–X2', and Y–Y' of FIG. 4.
Figure 9B:
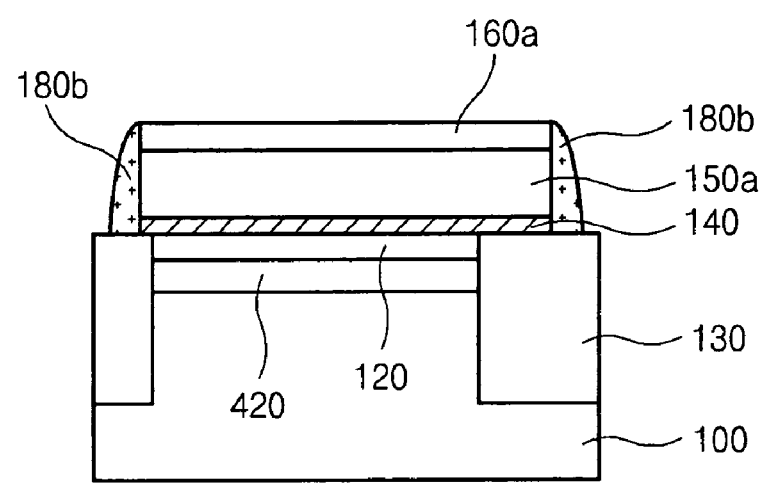
Figure 9C:
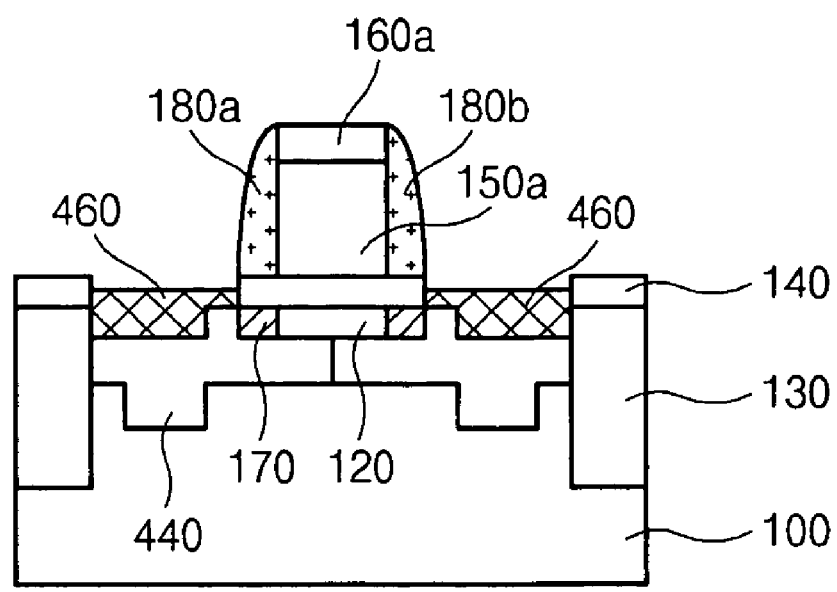

FIGS. 9A through 9C are cross-sectional views illustrating a semiconductor device in accordance with a third preferred embodiment of the present invention respectively taken along the line $X_1$–$X_1'$, $X_2$–$X_2'$, and Y–Y' of FIG. 4.

Referring to FIGS. 9A through 9C, the semiconductor device in accordance with a third preferred embodiment of the present invention is the same as that of the second preferred embodiment of the present invention shown in FIGS. 7A through 7C except a second Si epitaxial layer 440 covering sides of an LDD regions 170 below bottom portions of the first sidewall spacer 180a and the second sidewall spacer 180b.

FIGS. 10A through 10E are cross-sectional views illustrating a method for manufacturing semiconductor device in accordance with the third preferred embodiment of the present invention.

The processes shown in FIGS. 6A through to 6C are performed to form the structure shown in FIG. 6C.

Figure 10A:
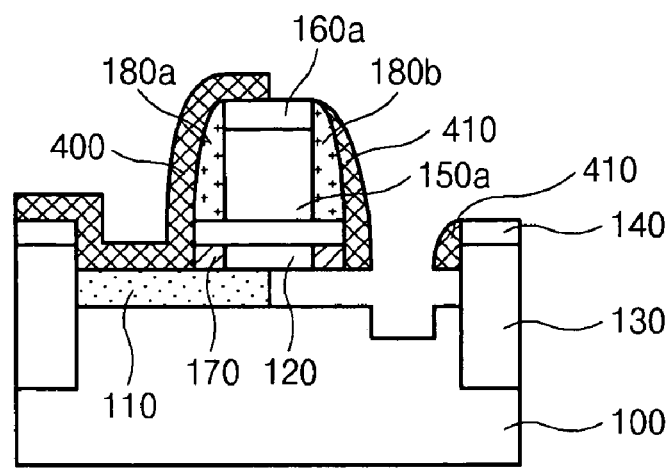
FIGS. 10A through 10E are cross-sectional views illustrating a method for manufacturing semiconductor device in accordance with the third preferred embodiment of the present invention.

Referring to FIG. 10A, an CVD insulating layer (not shown) is deposited on the entire surface, and then etched to form a first sidewall spacer 180a and a second sidewall spacer 180b on the first side 500a and the second side 500b, respectively. Thereafter, the gate insulating film 140 and the first Si epitaxial layer 120 at both sides of the gate structure are sequentially etched to expose the SiGe epitaxial layer 110.

Thereafter, a third CVD insulating film (not shown) is then disposed. The third CVD insulating film on the second sidewall spacer 180b is removed by etching using a photoresist film pattern (not shown) exposing a portion of the third CVD insulating film adjacent to the second sidewall 180b to simultaneously form a third CVD insulating film pattern 400 covering the SiGe epitaxial layer 110 adjacent to the first sidewall spacer 180a and a fourth CVD sidewall spacer 410 on a surface of the second sidewall spacer 180b, the gate insulating film 140, the first Si epitaxial layer 120 and an exposed side of the device isolation film 130 and to expose a surface of the SiGe epitaxial layer 110 adjacent to the fourth CVD sidewall spacer 410. Thereafter, the exposed SiGe epitaxial layer 110 adjacent to the fourth CVD sidewall spacer 410 is etched to expose a portion of the semiconductor substrate 100. The exposed portion of the semiconductor substrate 100 is then recessed via an etching process. Next, the photoresist film pattern is removed. A predetermined length of the SiGe epitaxial layer 110 is etched through an exposed side to form a second undercut under the first Si epitaxial layer 120.

Figure 10B:
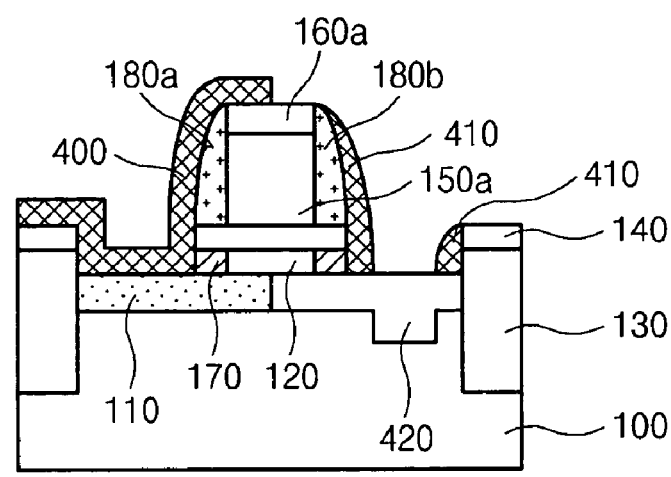

Referring to FIG. 10B, a buried oxide film 420 filling the second undercut and the recess adjacent to the fourth CVD sidewall spacer 410 is formed on the semiconductor substrate 100.

Figure 10C:
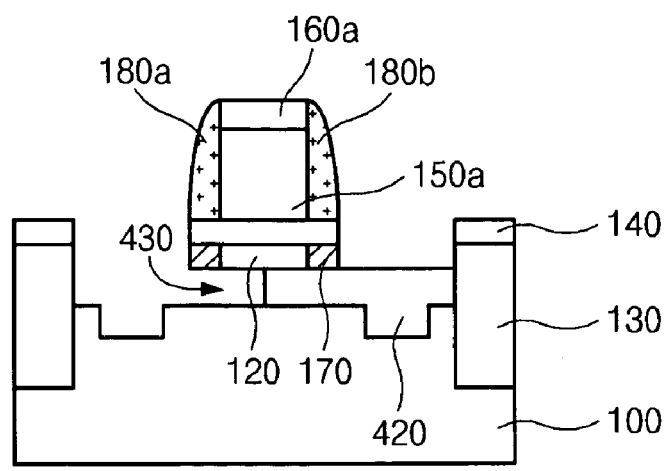

Referring to FIG. 10C, the third CVD insulating film pattern 400 is etched using a photoresist film pattern exposing the third CVD insulating film pattern 400 adjacent to the first sidewall spacer 180a as an etching mask to form a fifth CVD sidewall spacer (not shown) on a surface of the first sidewall spacer 180a, the gate insulating film 140, the first Si epitaxial layer 120 and an exposed portion of the device isolation film 130. An exposed portion of the SiGe epitaxial layer 110 and a predetermined thickness of the semiconductor substrate 100 are sequentially etched using the fifth CVD sidewall spacer as an etching mask. The photoresist film pattern is then removed. Thereafter, a remaining portion of the SiGe epitaxial layer 110 under the first Si epitaxial layer 120 is etched through a sidewall thereof to form a first undercut 430 under the first Si epitaxial layer 120. The fourth CVD sidewall spacer 410 and the fifth CVD sidewall spacer are then removed.

Figure 10D:
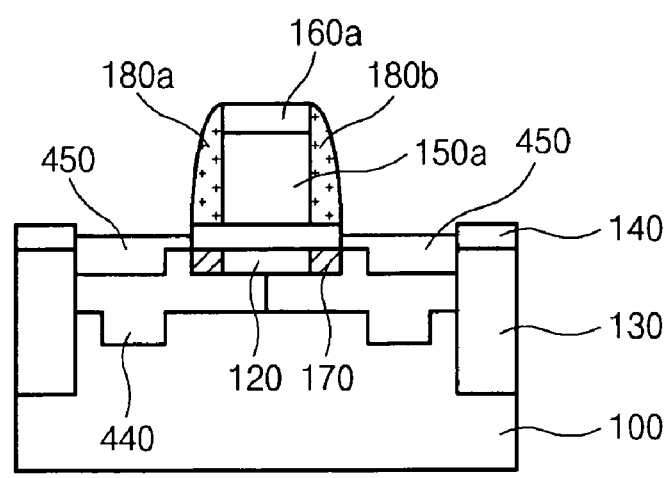

Referring to FIG. 10D, a second Si epitaxial layer 440 is formed in a space including the first undercut 430 adjacent to the first sidewall spacer 180a. The second Si epitaxial layer 440 at least fills up the first undercut 430 and the recess on the semiconductor substrate 100. Preferably, the second Si epitaxial layer 440 covers a side of the LDD region 170 at both sides of the gate structure. Thereafter, a polysilicon layer (not shown) is formed on the entire surface, and then etched back to form a polysilicon layer pattern 450 for a source/drain region on the second Si epitaxial layer 440 and the buried oxide film 420.

Figure 10E:
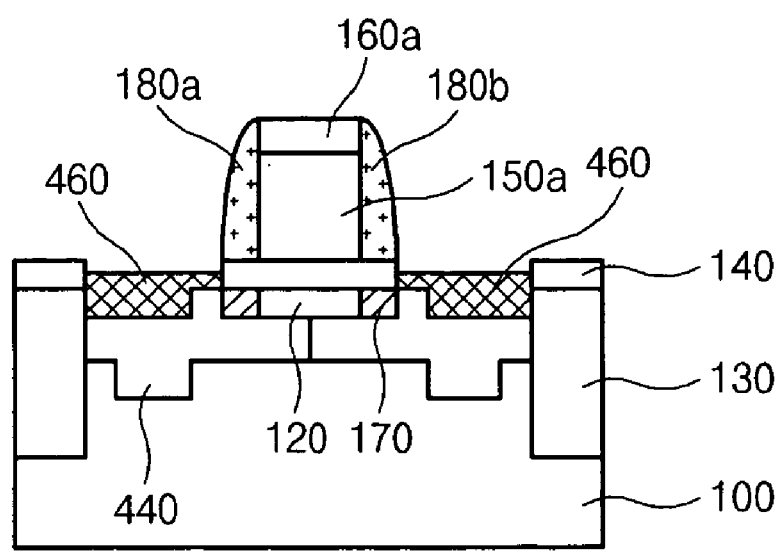

Referring to FIG. 10E, an impurity is implanted into the polysilicon layer pattern 450 to form a source/drain region 460.

As discussed earlier, in accordance with the present invention, one of a source and a drain regions and a portion of a channel region are disposed on a buried oxide layer formed on a semiconductor substrate and the other of the source and the drain regions and another portion of the channel region are disposed on a Si epitaxial layer formed on a semiconductor substrate to reduce a junction leakage current and junction capacitance and suppress a short channel effect thereby improving characteristics of the semiconductor device.

The foregoing description of various embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated.

What is claimed is:

1. A method for manufacturing semiconductor device, the method comprising the steps of:
    (a) forming a device isolation film defining an active region on a semiconductor substrate, the semiconductor substrate having a SiGe epitaxial layer and a first Si epitaxial layer stacked thereon;
    (b) sequentially forming a gate insulating film, a gate conductive layer and a first CVD insulating film on the first Si epitaxial layer and the device isolation film;
    (c) patterning the first CVD insulating film and the gate conductive layer to form a gate structure having a first side and a second side;
    (d) forming an LDD region on the first Si epitaxial layer at both sides of the gate structure;
    (e) forming a first sidewall spacer and a second sidewall spacer on the first side and the second side respectively;
    (f) at least etching a portion of the gate insulating film adjacent to the first sidewall spacer and the second sidewall spacer to expose a portion of the first Si epitaxial layer;
    (g) etching the exposed portion of the first Si epitaxial layer to expose a portion of the SiGe epitaxial layer;
    (h) etching the SiGe epitaxial layer adjacent to the first side and a predetermined thickness of the semiconductor substrate thereunder, wherein the SiGe epitaxial layer is partially etched so as to form a first undercut under the first Si epitaxial layer;
    (i) forming a second Si epitaxial layer in a space including the first undercut, wherein the second Si epitaxial layer at least fills up the first undercut;
    (j) performing an etching process to expose the SiGe epitaxial layer adjacent to the second side;
    (k) etching the SiGe epitaxial layer exposed in the step (j), wherein the SiGe epitaxial layer is removed so as to form a second undercut under the first Si epitaxial layer;
    (l) forming a buried oxide film filling up the second undercut in a space formed by removing the SiGe epitaxial layer;
    (m) forming a polysilicon layer on the buried oxide film filling up a space formed by removing the gate insulating film and the first Si epitaxial layer; and
    (n) implanting an impurity into the second Si epitaxial layer and the polysilicon layer to form a source/drain region.

2. The method according to claim 1, wherein the step (f) comprises etching only the portion of the gate insulating film adjacent to the first sidewall spacer.

3. The method according to claim 2, further comprising, after performing the step (j), forming a second CVD insulating film on an entire surface, and etching the second CVD insulating film to form a second CVD sidewall spacer on surfaces of the first sidewall spacer and the second sidewall spacer, the gate insulating film and an exposed side of the first Si epitaxial layer.

4. The method according to claim 3, further comprising, after performing the step (l), removing the second CVD sidewall spacer.

5. The method according to claim 1, wherein the step (f) comprises etching the portion of the gate insulating film adjacent to the first sidewall spacer and a portion of the gate insulating film adjacent to the second sidewall spacer.

6. The method according to claim 5, wherein the step (g) further comprises forming a third CVD insulating film on an entire surface after the SiGe epitaxial layer is exposed, and removing the third CVD insulating film on the first sidewall to expose a portion of the SiGe epitaxial layer adjacent to the first sidewall.

7. The method according to claim 6, wherein the step (j) further comprises simultaneously forming a third sidewall spacer on a surface of the second sidewall spacer, the gate insulating film, the first Si epitaxial layer and an exposed side of the device isolation film by etching the third CVD insulating film on the second sidewall, and exposing the SiGe epitaxial layer adjacent to the second sidewall.

8. The method according to claim 7, wherein the step (k) further comprises etching a predetermined thickness of the semiconductor substrate exposed by removing the SiGe epitaxial layer using the third CVD sidewall spacer as an etching mask.

9. The method according to claim 8, further comprising removing the third CVD sidewall spacer after performing the step (l).

10. The method according to claim 5, wherein the step (g) further comprises:
    forming a third CVD insulating film on an entire surface after the SiGe epitaxial layer is exposed; and
    simultaneously forming a third CVD insulating film pattern covering a surface of the first sidewall spacer, the first Si epitaxial layer and the device isolation film and forming a fourth CVD sidewall spacer on a surface of the second sidewall spacer, the gate insulating film, the first Si epitaxial layer and an exposed side of the device isolation film by etching the third CVD insulating film, and exposing the SiGe epitaxial layer adjacent to the second side.

11. The method according to claim 10, wherein the step (k) further comprising etching an exposed portion of the semiconductor substrate exposed by removing the SiGe epitaxial layer using the fourth CVD sidewall spacer as an etching mask.

12. The method according to claim 10, wherein the step (h) comprises:
    etching the third CVD insulating film to form a fifth CVD sidewall spacer;
    etching the SiGe epitaxial layer adjacent to the first sidewall and a predetermined thickness of the semiconductor substrate using the fifth CVD sidewall spacer as an etching mask to expose a sidewall of the SiGe epitaxial layer; and
    etching exposed sidewall of the SiGe epitaxial layer to form the first undercut under the first Si epitaxial layer.

13. The method according to claim 12, further comprising removing the fourth and the fifth CVD spacers after performing the step (l).

14. The method according to claim 10, wherein the second Si epitaxial layer simultaneous fills up the first undercut and covers the first sidewall spacer and a sidewall of the LDD region under the second sidewall spacer.

15. The method according to claim 14, further comprising forming a polysilicon layer on the second Si epitaxial layer.

* * * * *